(12) United States Patent
Coue et al.

(10) Patent No.: US 10,333,625 B2
(45) Date of Patent: Jun. 25, 2019

(54) METHOD FOR GENERATING REFERENCE CURRENTS IN PROPORTION TO ENABLE CONTROL OF AVERAGE POWER AND EXTINCTION RATIO OF LASER MODULATION IN AN OPTICAL TRANSMITTER

(71) Applicant: Hilight Semiconductor Limited, Hampshire (GB)

(72) Inventors: Dominique Coue, Hampshire (GB); William Redman-White, Alton Hants (GB)

(73) Assignee: HILIGHT SEMICONDUCTOR LIMITED, Hampshire (GB)

( * ) Notice: Subject to any disclaimer, the term of this patent is extended or adjusted under 35 U.S.C. 154(b) by 0 days.

(21) Appl. No.: 15/934,221

(22) Filed: Mar. 23, 2018

(65) Prior Publication Data
US 2018/0294886 A1   Oct. 11, 2018

(30) Foreign Application Priority Data
Apr. 7, 2017   (GB) .................................. 1705650.8

(51) Int. Cl.
| | | |
|---|---|---|
| H04B 10/00 | (2013.01) |
| H04B 10/50 | (2013.01) |
| H01S 5/0683 | (2006.01) |
| H04B 10/564 | (2013.01) |
| H04B 10/54 | (2013.01) |
| H01S 5/042 | (2006.01) |
| H01S 5/06 | (2006.01) |

(52) U.S. Cl.
CPC ....... *H04B 10/504* (2013.01); *H01S 5/06832* (2013.01); *H04B 10/5057* (2013.01); *H04B 10/54* (2013.01); *H04B 10/564* (2013.01); *H01S 5/0427* (2013.01); *H01S 5/0617* (2013.01)

(58) Field of Classification Search
CPC .. H04B 10/504; H04B 10/5057; H04B 10/54; H04B 10/564; H01S 5/06832
USPC ........................................................ 398/197
See application file for complete search history.

(56) References Cited

U.S. PATENT DOCUMENTS

| | | | | |
|---|---|---|---|---|
| 5,036,519 A | * | 7/1991 | Ema ........................ | G11B 7/126 369/116 |
| 6,195,371 B1 | * | 2/2001 | Haneda ................... | H01S 5/068 372/29.01 |

(Continued)

FOREIGN PATENT DOCUMENTS

EP          1289175          3/2003

*Primary Examiner* — Don N Vo
(74) *Attorney, Agent, or Firm* — Squire Patton Boggs (US) LLP

(57) ABSTRACT

A system for controlling an optical data transmitter includes control circuitry comprising a voltage controlled current source configured to generate a reference current configured to generate at least two output currents whose magnitudes are in a fixed ratio wherein at least one of said output currents is used by said control circuitry to control current driver circuitry, a first plurality of serially coupled resistors, a first plurality of switches, a second plurality of serially coupled resistors, a second plurality of switches, and a look-up-table configured to control the first plurality of switches and the second plurality of switches based on an input to control a ratio.

18 Claims, 10 Drawing Sheets

(56) References Cited

U.S. PATENT DOCUMENTS

2004/0028099 A1* 2/2004 Hongo .................. G02F 1/0123
   372/38.02
2004/0086006 A1* 5/2004 Tanikoshi ........... H01S 5/06804
   372/29.02
2014/0186056 A1 7/2014 Nuttgens

* cited by examiner

| Nomimal Extinction Ratio | Nominal Extinction Ratio dB | Best Fit Unit Resistors R2 | Best Fit Unit Resistor R1 | Extinction Ratio dB Actual | Error dB Actual | Normalised Output Current |
|---:|---:|---:|---:|---:|---:|---:|
| 3.00 | 4.77 | 25 | 13 | 5.01 | -0.07 | 5.20E-01 |
| 3.33 | 5.23 | 26 | 14 | 5.23 | 0.07 | 5.38E-01 |
| 3.67 | 5.64 | 28 | 16 | 5.64 | 0.02 | 5.71E-01 |
| 4.00 | 6.02 | 20 | 12 | 6.02 | 0.00 | 6.00E-01 |
| 4.33 | 6.36 | 24 | 15 | 6.37 | 0.01 | 6.25E-01 |
| 4.67 | 6.69 | 29 | 19 | 6.81 | -0.07 | 6.55E-01 |
| 5.00 | 6.99 | 28 | 19 | 7.18 | -0.08 | 6.79E-01 |
| 5.50 | 7.40 | 26 | 18 | 7.40 | 0.06 | 6.92E-01 |
| 6.00 | 7.78 | 28 | 20 | 7.78 | 0.04 | 7.14E-01 |
| 6.50 | 8.13 | 30 | 22 | 8.13 | 0.05 | 7.33E-01 |
| 7.25 | 8.60 | 29 | 22 | 8.62 | -0.08 | 7.59E-01 |
| 7.75 | 8.89 | 26 | 20 | 8.85 | 0.05 | 7.69E-01 |
| 8.50 | 9.29 | 19 | 15 | 9.29 | -0.03 | 7.89E-01 |
| 9.00 | 9.54 | 20 | 16 | 9.54 | 0.08 | 8.00E-01 |
| 10.00 | 10.00 | 22 | 18 | 10.00 | -0.02 | 8.18E-01 |
| 11.00 | 10.41 | 24 | 20 | 10.41 | -0.07 | 8.33E-01 |
| 12.00 | 10.79 | 19 | 16 | 10.67 | 0.03 | 8.42E-01 |
| 13.00 | 11.14 | 28 | 24 | 11.14 | -0.08 | 8.57E-01 |
| 14.00 | 11.46 | 30 | 26 | 11.46 | -0.04 | 8.67E-01 |
| 15.00 | 11.76 | 24 | 21 | 11.76 | 0.02 | 8.75E-01 |
| 16.50 | 12.17 | 26 | 23 | 12.13 | 0.01 | 8.85E-01 |
| 18.00 | 12.55 | 19 | 17 | 12.55 | -0.05 | 8.95E-01 |
| 19.00 | 12.79 | 30 | 27 | 12.79 | 0.07 | 9.00E-01 |
| 21.00 | 13.22 | 22 | 20 | 13.22 | 0.00 | 9.09E-01 |
| 23.00 | 13.62 | 24 | 22 | 13.62 | -0.04 | 9.17E-01 |
| 25.00 | 13.98 | 26 | 24 | 13.98 | -0.04 | 9.23E-01 |
| 27.00 | 14.31 | 28 | 26 | 14.31 | -0.01 | 9.29E-01 |
| 29.00 | 14.62 | 30 | 28 | 14.62 | 0.04 | 9.33E-01 |

METHOD FOR GENERATING REFERENCE CURRENTS IN PROPORTION TO ENABLE CONTROL OF AVERAGE POWER AND EXTINCTION RATIO OF LASER MODULATION IN AN OPTICAL TRANSMITTER

BACKGROUND OF THE INVENTION

In a fibre optical communications system, it is desirable to be able to control the modulation depth of the light generated by the transmitting laser device. In order to maintain fast switching between states and reduce noise, the transmitting laser is not switched to some defined power and then switched off, but for the low state its output is reduced to a low level. This modulation depth is also described as an extinction ratio (ER), the latter being the ratio of the optical intensity when there is a data '1' and the intensity when there is a data '0'. The current required by the laser to deliver these high and low optical outputs is not however constant and indeed is affected by the tolerances between individual laser devices, and also over time, due to the variation of a single laser device's characteristics due to heating and ageing. Such variations can occur in normal operation as a device heats up in use.

Hence it is desired not only to be able to compensate automatically for manufacturing tolerances and parameter drift in the laser itself, but also to be able to reach some defined target modulation level where the data pattern has a random characteristic with only limited low frequency content.

One method of providing a closed loop control for the laser output is to create a replica of the monitor photodiode output current by taking the incoming modulation data stream and using this to control reference currents and passing the combined current to a replica transimpedance amplifier (TIA) and associated circuitry. After suitable signal processing of the monitor and the replica path signals, the two may be compared in some manner and error information generated to facilitate closed loop control of the average optical power and the extinction ratio.

In order to construct such a closed loop control system using a replica path, it is necessary to be able to create a current signal that is equivalent to the current from an ideal photodiode which sensing the optical power output from the transmitting laser. This current signal must have not only the same average value as the ideal photocurrent, but also possess the same modulation depth or extinction ratio (ER). Hence it is necessary to be able to create currents that may be switched and combined so as to provide said replica of an ideal photocurrent with any desired value of ER. Analysis shows that the current values needed for this do not have a linear relationship with any convenient input variable. In most cases, a user might wish to set the target ER level in terms of decibels, and to be able to vary said ER in steps of decibels.

It is an object of some of the embodiments to provide currents suitable for such a control system where the relationship between the variable representing the demanded ER and the currents is achieved in a particularly convenient way and with attention to the minimisation of errors in creating said currents.

SUMMARY OF THE INVENTION

According to a first aspect there is provided a system for controlling an optical data transmitter comprising: current driver circuitry configured to supply a drive current to a laser diode; and monitor circuitry, said monitor circuitry comprising: a photodiode; and a first transimpedance amplifier coupled to said photodiode, wherein said monitor circuitry is configured to provide an output signal related to an optical intensity of said laser diode; a second transimpedance amplifier, said second transimpedance amplifier configured to be substantially identical in construction to said first transimpedance amplifier; control circuitry configured to control said current driver circuitry configured to compare at least one property of outputs of said first and second transimpedance amplifiers, and generate at least one control signal to control said current driver circuitry based on the comparison, wherein the control circuitry comprises a reference current generator which comprises: a defined current source; a voltage controlled current source configured to generate said reference current configured to generate at least two output currents whose magnitudes are in a fixed ratio wherein at least one of said output currents is used by said control circuitry to control said current driver circuitry; a first plurality of serially coupled resistors, each resistor from the first plurality of serially coupled resistors being a unit resistor and configured such that one end of the first plurality of serially coupled resistors is coupled to a first reference voltage; and a first plurality of switches, configured such that at least one switch of the first plurality of switches is associated with one of the first plurality of serially coupled resistors, and configured to couple the defined current source and a first controlling input terminal of the voltage controlled current source to a same resistor from the first plurality of serially coupled resistors; a second plurality of serially coupled resistors, each resistor of the second plurality of resistors being a unit resistor whose resistance is substantially identical to the unit resistors in the said first plurality of serially coupled resistors and configured such that one end of the second plurality of serially coupled resistors is coupled to the said reference voltage; a second plurality of switches, configured such that at least one switch of the second plurality of switches is associated with one of the second plurality of serially coupled resistors, and configured to couple a first output current from the voltage controlled current source and a second controlling input terminal of the voltage controlled current source to a same resistor from the second plurality of serially coupled resistors; and a look-up-table configured to control the first plurality of switches and the second plurality of switches based on an input to control a ratio between the defined current source current and at least one of the voltage controlled current source output current.

The first plurality of switches may comprise a first array of switches configured to couple the first plurality of serially coupled resistors to the defined current source, and a second array of switches configured to couple the first plurality of serially coupled resistors to a first controlling input terminal of the voltage controlled current source, wherein the look-up-table is configured to select one from the first array of switches and one from the second array of switches such that one of the first plurality of serially coupled resistors is coupled to the defined current source via the selected one from the first array of switches and coupled to said first controlling input terminal of the voltage controlled current source via the selected one from the second array of switches.

The second plurality of switches may comprise a third array of switches configured to couple the second plurality of serially coupled resistors to a second controlling input terminal of the voltage controlled current source, and a fourth array of switches configured to couple the second plurality of serially coupled resistors to a first output current from the voltage controlled current source, wherein the look-up-table is configured to select one from the third array of switches and one from the fourth array of switches such that one of the second plurality of serially coupled resistors is coupled to said second controlling input terminal of the voltage controlled current source via the selected one from the third array of switches and coupled to the said first output current from the voltage controlled current source via the selected one from the fourth array of switches.

The voltage controlled current source may comprise: an amplifier comprising the first controlling input selectively coupled by the first plurality of switches to the first plurality of resistors, and a second input selectively coupled by the second plurality of switches to the second plurality of resistors; at least one MOS transistor, a gate terminal of the at least one MOS transistor configured to be coupled to the output of the amplifier.

The voltage controlled current source may further comprise at least one further MOS transistor arranged in a cascode arrangement with the at least one MOS transistor.

The look-up-table may be configured to control the first plurality of switches and the second plurality of switches based on an input defining the ratio between the defined current source current and at least one of the voltage controlled current source output current based on a modulation depth and/or extinction ratio of the laser diode.

The look-up-table configured to control the first plurality of switches and the second plurality of switches may be generated by: searching all integer division ratios possible with a first number of the first plurality of resistors and a second number of the second plurality of resistors; and comparing each ratio with a desired value; and choosing an integer ratio with a lowest error from the desired value as the selection for controlling the first plurality of switches and the second plurality of switches.

The look-up-table configured to control the first plurality of switches and the second plurality of switches further may be further generated by: detecting at least two integer division ratios providing the lowest error; choosing an integer division ration from the at least two integer division ratios with a largest common multiple of unit value resistors that can be achieved.

Each resistor of the first plurality of resistors and the second plurality of resistors may have the same physical size within an integrated circuit which comprises the system.

According to a second aspect there is provided a method for controlling an optical data transmitter comprising: supplying a drive current to a laser diode; and providing an output signal related to an optical intensity of said laser diode; coupling a first transimpedance amplifier coupled to said output current; providing a second transimpedance amplifier, said second transimpedance amplifier configured to be substantially identical in construction to said first transimpedance amplifier; generating a reference current by: providing a defined current source; providing a voltage controlled current source configured to generate said reference current and configured to generate at least two output currents whose magnitudes are in a fixed ratio wherein at least one of said output currents is used to control said drive current; providing a first plurality of serially coupled resistors, each resistor from the first plurality of serially coupled resistors being a unit resistor and coupled such that one end of the first plurality of serially coupled resistors is coupled to a first reference voltage; providing a first plurality of switches, coupled such that at least one switch of the first plurality of switches is associated with one of the first plurality of serially coupled resistors, and able to couple the defined current source and a first controlling input terminal of the voltage controlled current source to a same resistor from the first plurality of serially coupled resistors; providing a second plurality of serially coupled resistors, each resistor from the second plurality of serially coupled resistors being a unit resistor whose resistance is substantially identical to the unit resistors in said first plurality of serially coupled resistors and coupled such that one end of the second plurality of serially coupled resistors is coupled to said reference voltage; providing a second plurality of switches, coupled such that at least one switch of the second plurality of switches is associated with one of the second plurality of serially coupled resistors, and able to couple a first output current from the voltage controlled current source and a second controlling input terminal of the voltage controlled current source to a same resistor from the second plurality of serially coupled resistors; and controlling the first plurality of switches and the second plurality of switches by providing a look-up-table based on an input to control a ratio between the defined current source current and at least one of the voltage controlled current source output current; and controlling said drive current based on comparing at least one property of outputs of said first and second transimpedance amplifiers and the reference current.

Providing the first plurality of switches may comprise: providing a first array of switches coupling the first plurality of serially coupled resistors to the defined current source; providing a second array of switches coupling the first plurality of serially coupled resistors to the first controlling input terminal of the voltage controlled current source, wherein controlling the first plurality of switches and the second plurality of switches comprises: selecting one from the first array of switches and one from the second array of switches such that one of the first plurality of serially coupled resistors is coupled to the defined current source via the selected one from the first array of switches and coupled to said first controlling input terminal of the voltage controlled current source via the selected one from the second array of switches.

Providing the second plurality of switches comprises: providing a third array of switches coupling the second plurality of serially coupled resistors to a second controlling input terminal of the voltage controlled current source; providing a fourth array of switches coupling the second plurality of serially coupled resistors to a first output current from the voltage controlled current source, wherein controlling said drive current further comprises selecting one from the third array of switches and one from the fourth array of switches such that one of the second plurality of serially coupled resistors is coupled to said second controlling input terminal of the voltage controlled current source via the selected one from the third array of switches and coupled to the said first output current from the voltage controlled current source via the selected one from the fourth array of switches.

Providing the voltage controlled current source may comprise: providing an amplifier comprising: the first controlling input selectively coupled by the first plurality of switches to the first plurality of resistors, and the second controlling input selectively coupled by the second plurality of switches to the second plurality of resistors; and providing at least one MOS transistor, a gate terminal of the at least one MOS transistor coupled to the output of the amplifier.

Providing the voltage controlled current source may further comprise providing at least one further MOS transistor arranged in a cascode arrangement with the at least one MOS transistor.

Controlling the first plurality of switches and the second plurality of switches may comprise controlling the first plurality of switches and the second plurality of switches based on an input defining the ratio between the defined current source current and at least one of the voltage controlled current source output current based on a modulation depth and/or extinction ratio of the laser diode.

The method may further comprise generating the look-up-table controlling the first plurality of switches and the second plurality of switches by: searching all integer division ratios possible with a first number of the first plurality of resistors and a second number of the second plurality of resistors; comparing each ratio with a desired value; and choosing an integer ratio with a lowest error from the desired value as the selection for controlling the first plurality of switches and the second plurality of switches.

Generating the look-up-table for controlling the first plurality of switches and the second plurality of switches may further comprise: detecting at least two integer division ratios providing the lowest error; choosing an integer division ration from the at least two integer division ratios with a largest common multiple of unit value resistors that can be achieved.

The method may further comprise providing each resistor of the first plurality of resistors and the second plurality of resistors as the same physical size within an integrated circuit.

According to a third aspect there is provided an apparatus for controlling an optical data transmitter comprising: means for supplying a drive current to a laser diode; and means for providing an output signal related to an optical intensity of said laser diode; means for coupling a first transimpedance amplifier coupled to said output current; means for providing a second transimpedance amplifier, said second transimpedance amplifier configured to be substantially identical in construction to said first transimpedance amplifier; means for generating a reference current comprising: means for providing a defined current source; means for providing a voltage controlled current source configured to generate said reference current and configured to generate at least two output currents whose magnitudes are in a fixed ratio wherein at least one of said output currents is used to control said drive current; means for providing a first plurality of serially coupled resistors, each resistor from the first plurality of serially coupled resistors being a unit resistor and coupled such that one end of the first plurality of serially coupled resistors is coupled to a first reference voltage; means for providing a first plurality of switches, coupled such that at least one switch of the first plurality of switches is associated with one of the first plurality of serially coupled resistors, and able to couple the defined current source and a first controlling input terminal of the voltage controlled current source to a same resistor from the first plurality of serially coupled resistors; means for providing a second plurality of serially coupled resistors, each resistor from the second plurality of serially coupled resistors being a unit resistor whose resistance is substantially identical to the unit resistors in said first plurality of serially coupled resistors and coupled such that one end of the second plurality of serially coupled resistors is coupled to said reference voltage; means for providing a second plurality of switches, coupled such that at least one switch of the second plurality of switches is associated with one of the second plurality of serially coupled resistors, and able to couple a first output current from the voltage controlled current source and a second controlling input terminal of the voltage controlled current source to a same resistor from the second plurality of serially coupled resistors; and means for controlling the first plurality of switches and the second plurality of switches by providing a look-up-table based on an input to control a ratio between the defined current source current and at least one of the voltage controlled current source output current; and controlling said drive current based on comparing at least one property of outputs of said first and second transimpedance amplifiers and the reference current.

The means for providing the first plurality of switches may comprise: means for providing a first array of switches coupling the first plurality of serially coupled resistors to the defined current source; means for providing a second array of switches coupling the first plurality of serially coupled resistors to the first controlling input terminal of the voltage controlled current source, wherein controlling the first plurality of switches and the second plurality of switches comprises: means for selecting one from the first array of switches and one from the second array of switches such that one of the first plurality of serially coupled resistors is coupled to the defined current source via the selected one from the first array of switches and coupled to said first controlling input terminal of the voltage controlled current source via the selected one from the second array of switches.

The means for providing the second plurality of switches may comprise: means for providing a third array of switches coupling the second plurality of serially coupled resistors to a second controlling input terminal of the voltage controlled current source; means for providing a fourth array of switches coupling the second plurality of serially coupled resistors to a first output current from the voltage controlled current source, wherein controlling said drive current further comprises selecting one from the third array of switches and one from the fourth array of switches such that one of the second plurality of serially coupled resistors is coupled to said second controlling input terminal of the voltage controlled current source via the selected one from the third array of switches and coupled to the said first output current from the voltage controlled current source via the selected one from the fourth array of switches.

The means for providing the voltage controlled current source may comprise: amplifier means comprising: the first controlling input selectively coupled by the first plurality of switches to the first plurality of resistors, and the second controlling input selectively coupled by the second plurality of switches to the second plurality of resistors; and at least one MOS transistor means, a gate terminal of the at least one MOS transistor coupled to the output of the amplifier.

The means for providing the voltage controlled current source may further comprise: at least one further MOS transistor means arranged in a cascode arrangement with the at least one MOS transistor means.

The means for controlling the first plurality of switches and the second plurality of switches may comprise means for controlling the first plurality of switches and the second plurality of switches based on an input defining the ratio between the defined current source current and at least one of the voltage controlled current source output current based on a modulation depth and/or extinction ratio of the laser diode.

The apparatus may further comprise means for generating the look-up-table for controlling the first plurality of switches and the second plurality of switches, the means for generating may comprise: means for searching all integer division ratios possible with a first number of the first plurality of resistors and a second number of the second plurality of resistors; means for comparing each ratio with a desired value; and means for choosing an integer ratio with a lowest error from the desired value as the selection for controlling the first plurality of switches and the second plurality of switches.

The means for generating the look-up-table may further comprise: means for detecting at least two integer division ratios providing the lowest error; means for choosing an integer division ration from the at least two integer division ratios with a largest common multiple of unit value resistors that can be achieved.

The apparatus may further comprise each resistor of the first plurality of resistors and the second plurality of resistors are the same physical size within an integrated circuit.

BRIEF DESCRIPTION OF THE DRAWINGS

Some embodiments will now be described solely by way of example and with reference to the accompanying drawings in which:

FIG. 8 shows an example of the method of selecting equal resistor elements to create a desired non-linear response for extinction ratio.

DETAILED DESCRIPTION

The description of the embodiments is not to be taken in a limiting sense but is made merely for the purposes of describing the general principles of the embodiments of the invention. For example, the number of resistors employed may be varied in order to meet different specifications for the residual error in this digital to analogue (DAC) architecture. Further, this type of DAC may be arranged for some purpose unrelated to optical communications wherein a non-linear DAC is desired, and may be configured with a completely different type of relationship between the code and the output current. It may be configured so that the output function is not monotonic.

Figure 1:
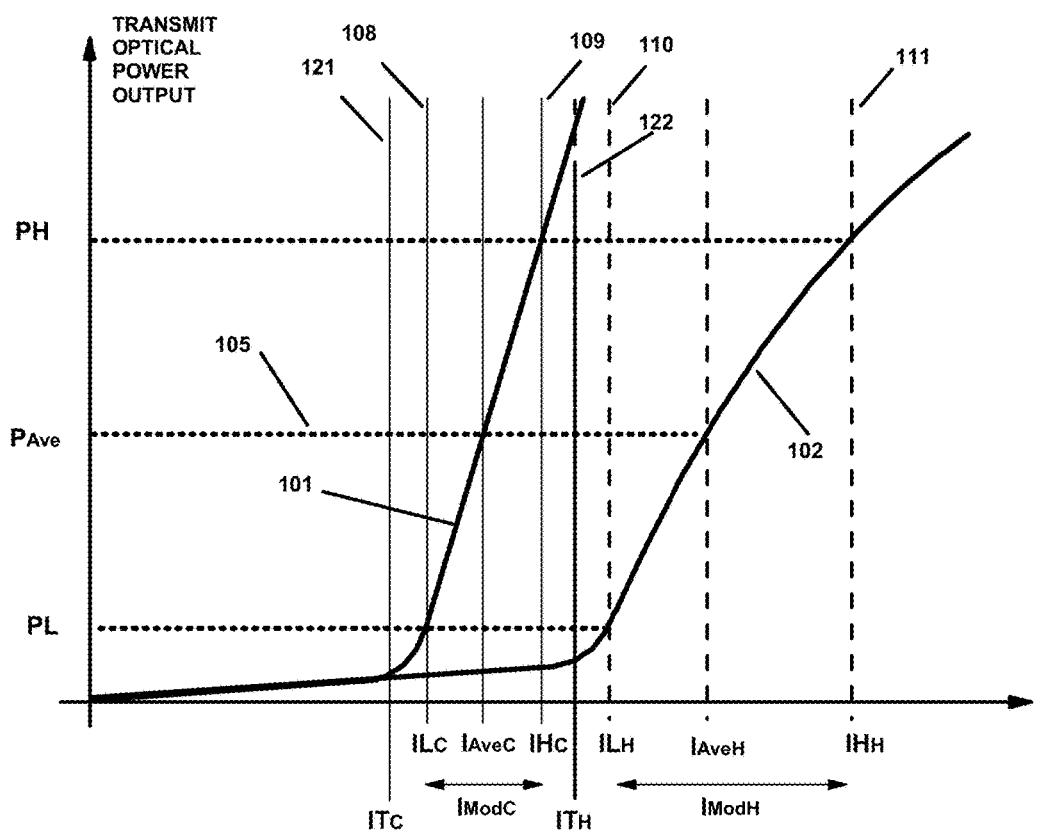
FIG. 1 shows typical laser characteristics vs temperature.

FIG. 1 is a diagrammatic representation of the characteristics of a typical laser diode as is used in optical communications systems. When used to generate a modulated optical signal, the current through the laser diode is modulated such that the minimum current 108 is above the threshold value 121 for the laser, and the maximum current 109 is below the manufacturer's ratings for the device. When a laser diode is cold, or the current levels are relatively low, a simple linear model 101 may suffice. However, when the laser diode heats up, or as its characteristics change with age, the threshold current may change 122 and the relationship may exhibit a more curved shape 102. Thus, the minimum current 110 and the maximum current 111 should both be increased in such a way as to maintain the desired average optical output 105 and the desired ER during operation. Maintaining such control over a system's lifetime is not a trivial task.

In any given practical system, the maximum current may be set so that the average operating power of the laser is set to a defined level with regard to the required signal level for reliable communications to be established. A critical parameter in such a system is the ratio of the maximum to minimum optical output, usually referred to as the Extinction Ratio (ER), as this affects the signal to noise levels for the receiver. The ER is a function of the minimum and maximum laser diode current values, and is sometimes represented as a simple linear relationship, but in reality this is not an accurate representation.

Figure 2:
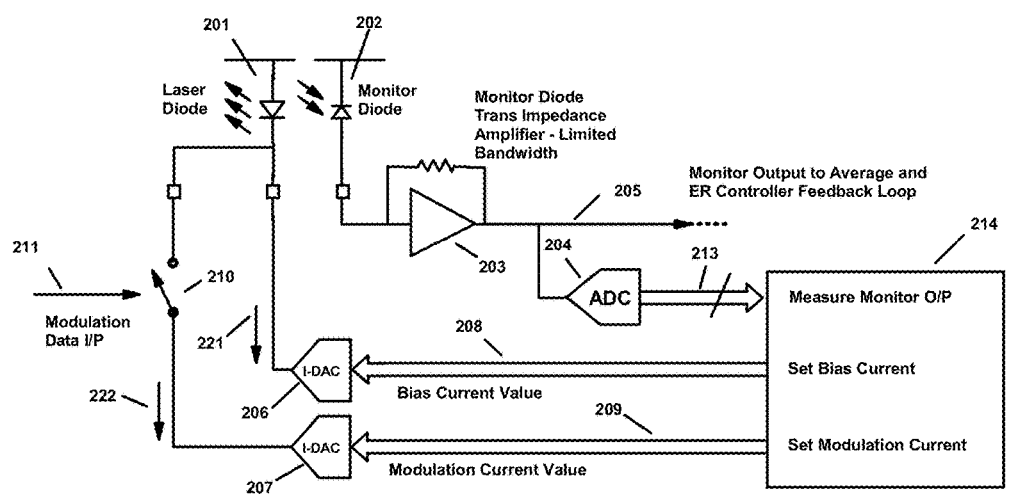
FIG. 2 shows an exemplar optical transmitter and monitor channel architecture.

FIG. 2 shows the typical arrangement in a transmitter suitable for an optical communications system. A laser diode 201 is provided with a current having a steady element and a variable element. This may be in the form of an average current with a bi-directional modulation current adding and subtracting current to create the optical maxima and minima; alternatively there may be a smaller steady bias current 221 with a modulation current 222 that is disconnected by means of a switching function 210 to indicate a logical low level in the modulation data input 211, or connected by said switching function 210 to add to said current 221 to indicate a logical high value. The latter variant is represented in FIG. 2. These currents 221 and 222 may be provided by digital-to-analogue converters 206 and 207 respectively having current outputs controlled by digital values 208 and 209 respectively that are set by the controller function 214.

The optical output of the laser diode 201 is sensed by a monitor photodiode 202 to create a current proportional to the sensed optical level and which may be converted to a voltage 205 with a trans-impedance amplifier 203. The combination of the monitor diode 202 and amplifier 203 typically have a bandwidth that is substantially less than that of the main data channel bandwidth. This monitor value 205 may be converted to digital form 213 by means of an analogue-to-digital converter 204 and these data may be used by the controller 214 to set the laser diode current levels (in this example 221 and 222) according to some mechanism. The bandwidth limitation of the monitor channel is very significant in the implementation of any transmit optical level control mechanism since it restricts the observability of the peak and trough values of the optical signal.

Figure 3:
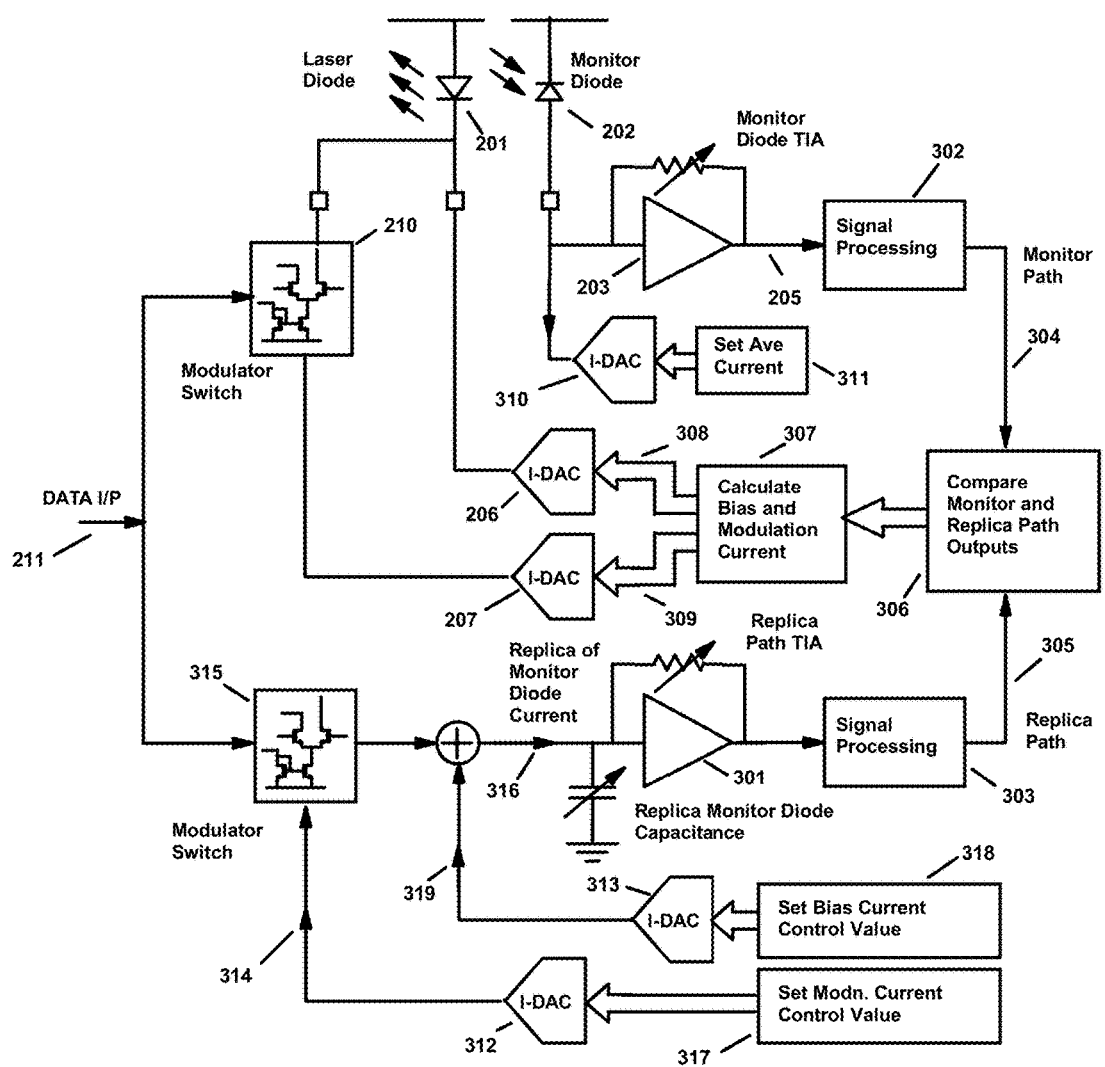
FIG. 3 shows an architecture for an optical transmitter including a replica of the monitor channel to provide closed loop control of the laser output.

FIG. 3 shows an exemplar arrangement for an optical transmitter system wherein a replica signal path is used to provide comparison references in order to create a control loop capable of setting and maintaining both the average power and the modulation ER. In this example, the optical output from the laser 201 is monitored by means of a photodiode 202, whose current is converted to a voltage by means of a trans-impedance amplifier (TIA) 203. For reasons of cost and power, the bandwidth of the combination of this amplifier 203 and the photodiode 202 will typically be much less than the symbol rate of the transmitted optical signal. The output 205 of said TIA 203 is passed to some manner of signal processing 302 to extract at least one feature of the monitor signal as may be useful for the control loop, such as the mean, peak to peak, or the standard deviation. This signal processing function may be a one or a combination of common functions for example filters, peak detectors and root-mean-square detectors. The output 304 of said signal processing function is then passed to a comparison function 306 in order to create control signals for the bias 308 and modulation ER 309 current settings for the laser diode. It is common to either set or control the average current expected from the monitor diode and extract this from the input of the TIA 203 by means of a variable current sink or source, or by means of a current DAC 310. This has the advantage that the TIA 203 is not required to handle a DC component with a potentially very large range of values. The function controlling 311 said DAC 310 may be controlled directly by the user application or indirectly via the feedback controller 306.

In order for the abovementioned feedback paths to be able to set the average and ER values to match the requirements of the system user, some form of reference values may be either explicitly or implicitly included in the feedback loops. In FIG. 3 the references required for the comparison function 306 are provided by means of the output 305 a replica signal channel. The input to this replica channel is a current 319 representing the ideal current that would be created by a photodiode with a frequency response bandwidth equal to or greater than the symbol rate. This replica current may be configured to include the average current, or it may be calculated and configured so as to take account of the removal of the average current from the photodiode in a manner as exemplified by the use of the DAC 310. The latter case makes the replica circuitry and the monitor circuitry easier to design and construct.

The incoming data stream 211 is applied to a replica modulator circuit 315 which either takes its other input in terms of a modulation current 314 which is combined with a bias current 315, or alternatively as an average current and modulation current. The former arrangement is shown in this example. This modulated current 316 is passed to a TIA 301 that is a replica of the monitor photodiode TIA 203. Further, the gain and bandwidth of this replica amplifier 301 can be configured such that they can be made substantially identical to those of the monitor channel. The output of said replica TIA is then passed to a signal processing function 303 that is identical the signal processing function 302 in the monitor channel. In this way, if the current from the replica channel modulator is the same as the current from the monitor photodiode (which may have the DC component removed in the aforesaid manner), then the replica channel output 305 will be substantially the same as the output 304 from the monitor channel. Thus differences between these two signals can be used by the comparison function 306 to create the required feedback signals needed to correct and control the laser's average power and modulation ER.

Using these error signals, the control function 307 determines the required settings 309 and 308 for the DACs 207 and 206 that set the transmit laser bias 221 and modulation 222 currents.

Figure 4:
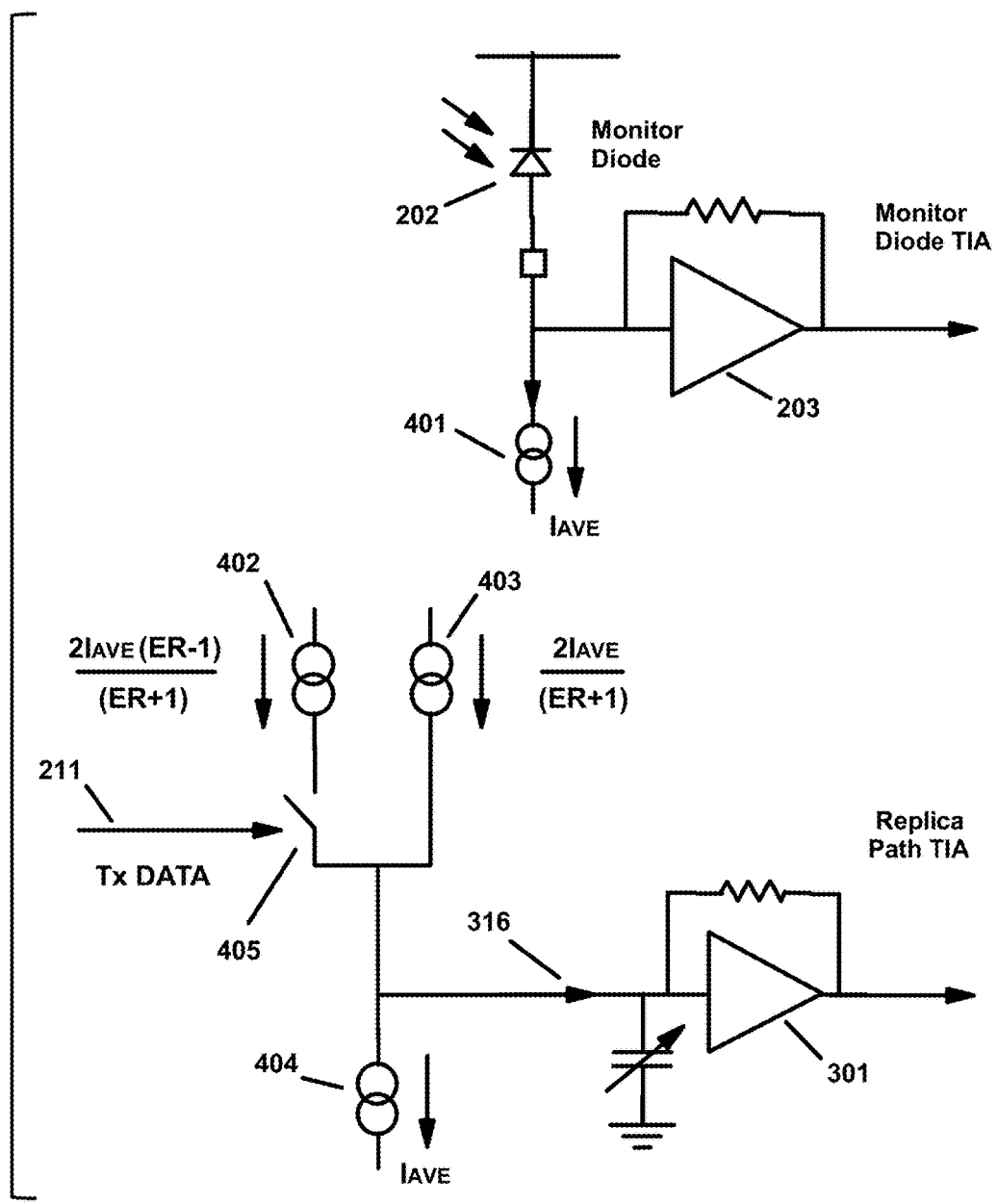
FIG. 4 shows a configuration of current sources and switches intended to replicate the current from an ideal photodiode.

The manner in which the replica bias and modulation currents required for such a system are generated and controlled is the problem addressed by some embodiments of the invention. The current values have a non-linear relationship with the input variables expected from the user. Further, there are several options for creating these currents and combining them in such a way that the desired bias and modulation appear at the input to the replica TIA. FIG. 4 shows a representation of one possible configuration. Monitor TIA is shown with a current sink 401 configured so as to remove the average current from the monitor photodiode 202 such that the monitor TIA is not required to pass any significant DC component. To replicate the same input current, the replica TIA 301 has a combination of currents sources and a sink configured with a replica modulator switch 405.

A replica current sink 404 is provided that will have a value substantially the same as that of the monitor channel average current sink 401. To create the desired modulation of this average value we may add a fixed current source 403 and switch in another current source 402 in a manner controlled by the incoming data stream. The values of the sources 402 and 403 are functions of the average current 404 $I_{AVE}$ and the ER required by the user, and as such will take a range of values. When the currents from source 403 and sink 404 are connected, the resulting input current is still a net sink value, and represents a minimum trough in the current waveform. When the source 402 is also connected by the application of valid data to the replica modulator switch 405, the net current becomes a source representing a maximum peak in the current waveform. The sources 402 and 403 may configured to depend on the average current and the required ER in such a way that the peak and trough values are substantially symmetrical about the average. A disadvantage of using this arrangement is that the range of current from the source 403 can be very large. For example, if the ER is required to cover the linear range from 3 to 28 (representing approximately 5 dB to 14 dB) to current must have minimum to maximum ratio of 1:7.5 with non-linear increment steps. If the average current value is fixed, this is not too difficult an engineering task. However, in practical applications the average current $I_{AVE}$ may vary by more than a decade and so the currents 402 and 403 related to ER must be scaled in proportion. Such a situation will make the design of the source 403 in particular very challenging.

Figure 5:
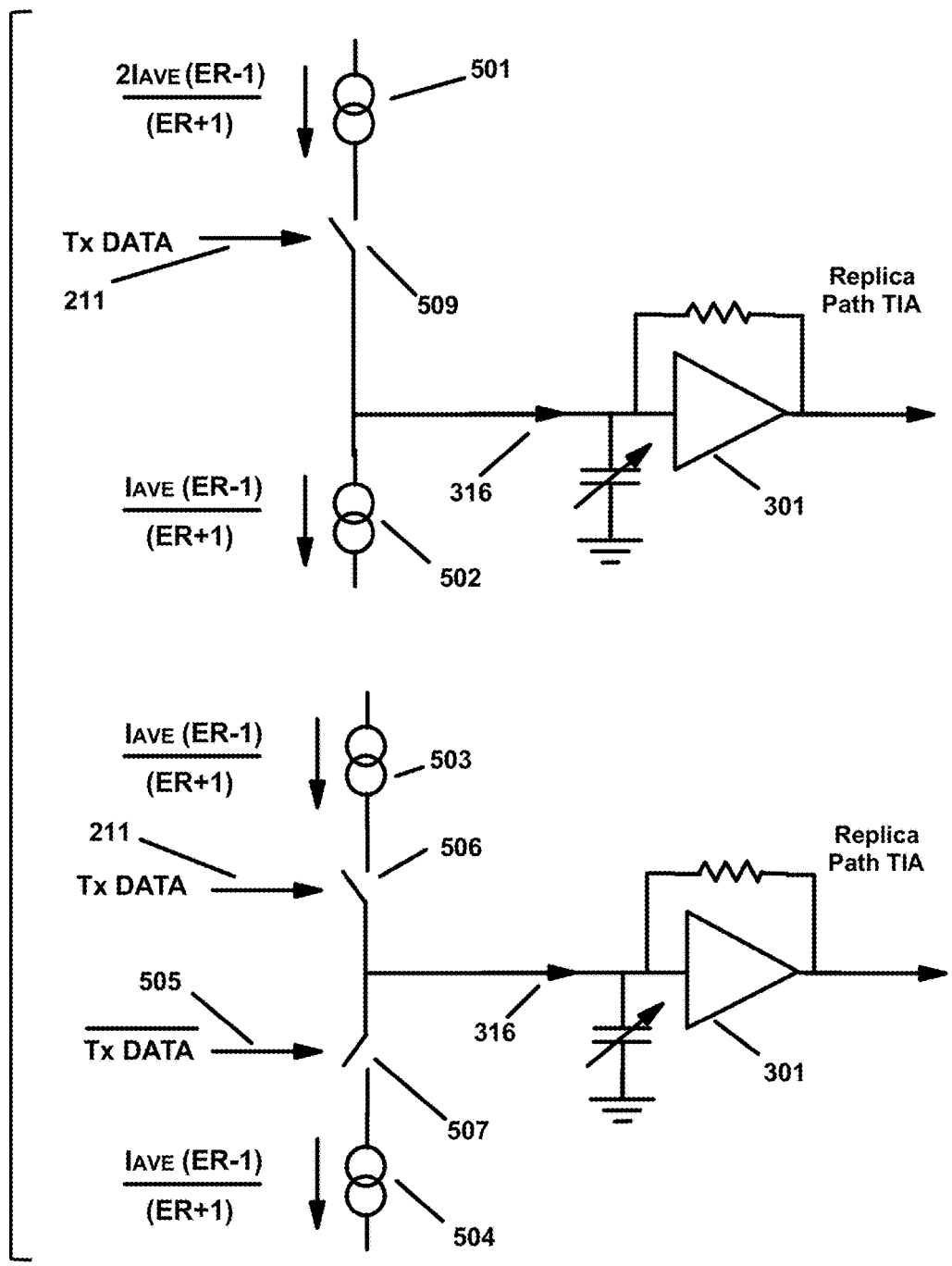
FIG. 5 shows further configurations of current sources and switches intended to replicate the current from an ideal photodiode.

FIG. 5 shows alternative configurations for the creation of currents suitable for the replica channel in the abovementioned system. By replacing the fixed sink current 404 with a current sink 502 that is also dependent on the required ER the minimum to maximum ratio as a function of ER is much reduced. Taking the same ER range as previously used as an example, the ratio is only 1:1.87 making the design task much easier. A single modulator switch 509 is required and only a variable current source 501 is required with a similar minimum to maximum ratio as that in sink 502. In a further variation in the configuration, at the cost of using two complementary replica modulator switches 506 and 507 controlled by complementary versions of the data stream 211 and 505, some power may be saved if the current source 503 and sink 504 are configured made to have the same values. Using this arrangement may be convenient inasmuch as it allows a single master source to be used followed by current copying arrangements.

It is an aim of some embodiments to be able to generate the reference currents required for the setting and control of the average and ER of the transmitted optical signal as described above in a convenient manner well suited to design and compact fabrications integrated circuit technology and having robust performance in terms of tolerance to manufacturing errors. A method of generating the currents required as described above could be with the use of current mirrors having different transistor sizes in the input and output branches. However, it will be apparent to one skilled in the art that to achieve accurate ratios, device sizes will need to be multiples of some lowest common denominator, leading to a very large number of unit size devices. If device sizes are scaled directly to achieve the desired current ratios, errors arising from simple geometric device scaling will become apparent.

In some embodiments of the invention, a current scaling function is achieved by configuring at least two strings of equal value resistors, with a feedback arrangement comprising an amplifier and at least one transistor.

Figure 6:
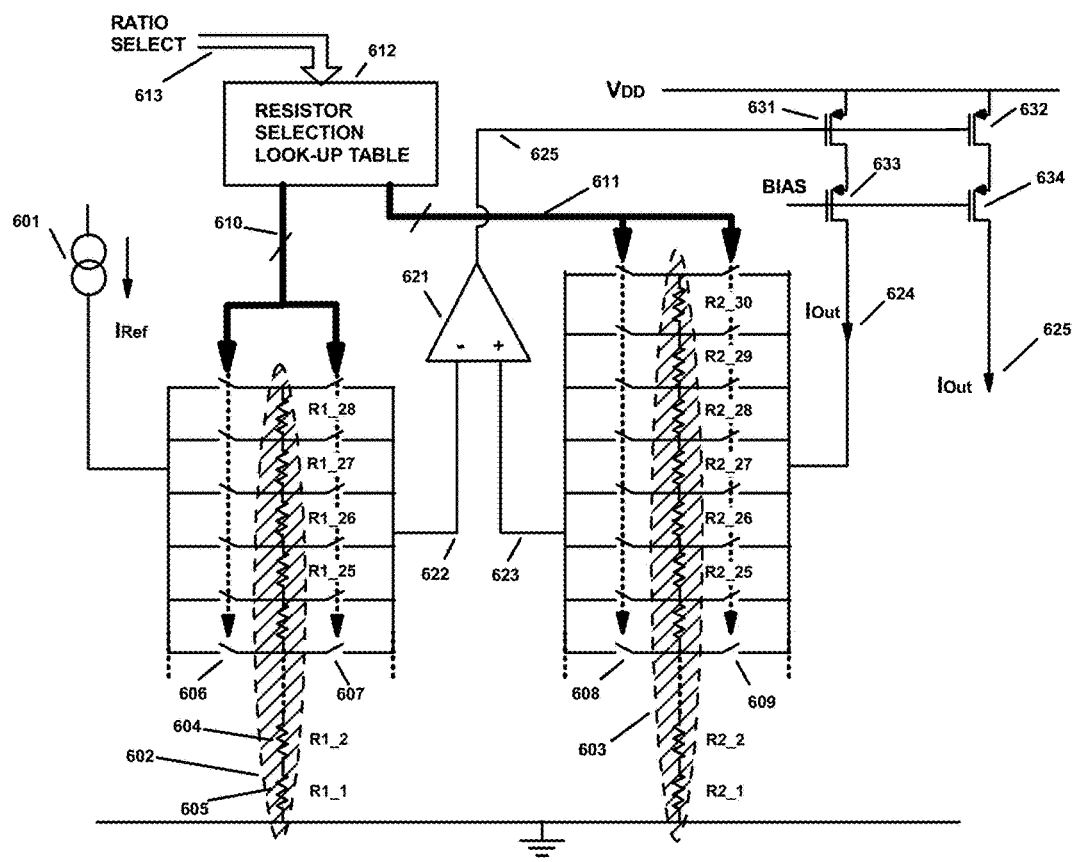
FIG. 6 shows a digital to analogue converter configured to create currents in a non-linear relationship with the input code.

FIG. 6 shows an exemplar configuration illustrating the embodiments. A resistance array 602 is composed of a plurality of equally sized resistors 604, 605 etc. This is beneficial from a manufacturing point of view as it is preferred in an integrated circuit required to provide very high precision to employ electronic elements of a given size and combine these rather than scale the physical dimensions of elements. Each resistor may have the same physical size and layout, and use well known techniques to achieve excellent uniformity. The number of elements in the resistance array is a matter for design choice according to the performance specifications for said current scaling function chosen according to methods to be described later. Between elements of the connections between the resistor elements connections can be made by means of switches 606, 607 etc. Current may be fed into one of the connection points from a reference input current 601. That is to say, at any given time only one of the switches 606 makes a connection. This current will flow through some of the resistors to a reference voltage node in the circuit, typically the ground node and a voltage will become generated at the selected connection node proportional to the injected reference current and the total aggregate resistance to ground. At the connection node where the reference current 601 is injected a corresponding switch is closed and connects this node to the input 622 of a high gain amplifier 621. This amplifier input can have a very high resistance such that the current flowing through the switch connecting it creates a negligibly small voltage drop. In this way the amplifier input senses the voltage created in the resistor array with negligible error.

In FIG. 6 there is shown a second resistance array 603 comprised of a plurality of equally sized resistors each having the same electrical and physical characteristics as those in the first resistance array 602. The number of resistor elements in this array may be the same as in the first array or may be different, depending on the specifications for the current scaling function. At connection nodes between these resistor elements it is possible to connect a second input 623 to said amplifier 621 via one of a plurality of switches 608. At the same node to which said second amplifier input is connected, a corresponding switch 609 may make a connection to at least one transistor configured as a current source. In FIG. 6 the said current source is comprised of a first Metal-Oxide-Semiconductor (MOS) transistor 631 controlling the current and a second MOS transistor 633 acting as a cascode to raise the output resistance in a manner well known to ones skilled in the art. Other current source configurations will also be apparent to ones skilled in the art. Said current source comprising transistors 631 and 633 is controlled by the output of said amplifier 621 such that a feedback loop is created whereby the inputs 622 and 623 of said amplifier 621 will settle at substantially the same voltage after any settling time due to the amplifier's bandwidth. By the use of two switches 608 and 609 to connect the amplifier input 623 and the current source 631/633 to a point in the resistor array it is possible to eliminate errors due to the finite resistances of said switches.

The voltage at the inverting input 622 is set by the input current 601 $I_{Ref}$ and by the number of equal value resistors 602 in series that are connected to ground as selected by one of the switches 606. Hence the product of the current from the current source 631/633 and the total resistance of the equal value resistors 603 that are connected to ground as selected by one of the switches 609 must result in a voltage at the amplifier's non-inverting input 623 that is equal to the voltage at the other (inverting) input 622. Thus if the value of each resistor is denoted by R, the number of resistors 602 selected on the input side is A, and the number of resistors 603 on the output side is B, it follows that the output current $I_{Out}$ 624 will be given by $I_{Out}=(B \times I_{REF})/A$.

The current provided by the source 631/633 may be replicated as many times as is convenient by means of at least one further current source structure comprising transistor 632 and cascode transistor 634 to provide a current output 625. This current may the same at the current 624 fed back to the resistor array 603, or it may be scaled by adjusting the dimensions of transistors 632 and 634 in the conventional way.

A significant design challenge with the basic topology is in creating an arbitrary ratio B/A between the input and output currents particularly when the ratios required follow some non-linear incremental progression. Rather than use a very large number of resistors to seek some integer common denominator or to attempt to trim individual resistor values, a look-up table 612 is used to translate the incoming data 613 that is commanding a desired ratio, and to translate the resistor selection control 610 for the input array 602 and the resistor selection control 611 for the output array 603 such that a best fit to the desired ratio is achieved while using only equally valued resistors. It will be apparent to one skilled in the art that the ratio may be achieved with high precision using a very large pair of resistor arrays. In the described invention, a look up table 612 is created by searching all integer division ratios possible with the number of provided resistors in the input array 602 and the output array 603, and comparing each ratio with the ideal desired value and choosing the best fit. With a prescribed maximum error tolerance it is then possible to decide if the number of equal value resistors in each array is sufficient to meet the specifications, and hence if the resistor arrays must have more elements added. This method of selecting the resistor elements will not follow an analytic expression but each selection for each desired ratio obtained by a search. For some ratios of the numbers of equal value resistors to be selected, a ratio of two small integers may provide the smallest error. In this case, any further errors due to the manufacturing tolerances between the nominally equal valued resistors may be reduced by choosing the largest common multiple of unit value resistors that can be achieved from within the available arrays.

Figure 7:
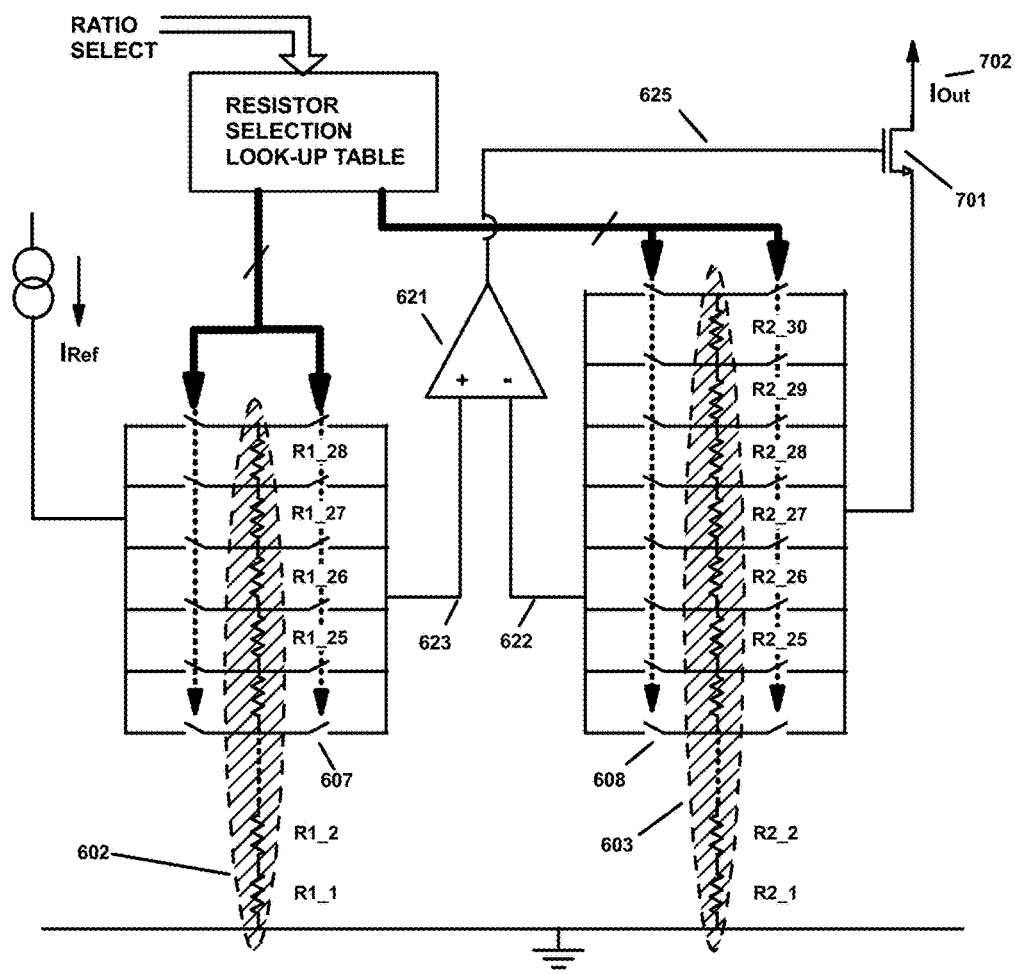
FIG. 7 shows a further digital to analogue converter configured to create currents in a non-linear relationship with the input code.

FIG. 7 shows some alternative embodiments according to the invention. The polarity of the inputs to the amplifier 621 are reversed such that the non-inverting input 623 can be connected via one of switches 607 to the array of equal value resistors 602 receiving the input reference current 601, and the inverting input 622 of said amplifier 621 can be connected via one of switches 608 to the array of equal value resistors 603 through which the output current is passed. The output 625 of said amplifier is used to control the gate of a MOS transistor 701. Said transistor will pass a current 702 $I_{Out}$ that flows into the resistor array 603 by means of one of switches 609 so as to create a voltage at a point in the said resistor array that is communicated to the non-inverting input of said amplifier in such a way that a negative feedback loop is formed. The loop will settle such that the amplifier inputs 622 and 623 have voltages apparent that are substantially identical, and in this situation the current flowing through transistor 701 will follow the same ratio relationship as determined by the switch selection as controlled by the loop up table 612 as previously described. In these embodiments the output current is provided as a sink rather than a source.

It will apparent to one skilled in the art that the embodiments in FIGS. 6 and 7 may be modified using opposite polarity MOS transistors so that the directions of current flow may be easily reversed with respect to the power supply lines.

FIG. 8 shows an example look up table 801 providing the calculations intended to provide the currents required for the replica signal path to have the correct average and ER values desired by the control and feedback system for the laser. In this example, the input resistor array 602 has 28 equal value resistors, and the output resistor array 603 has 30 equal value resistors. With a desired linear ER range from 4.77 dB to 14.6 dB in equal 0.34 dB steps, the error is maintained at less than 0.1 dB.

Figure 9:
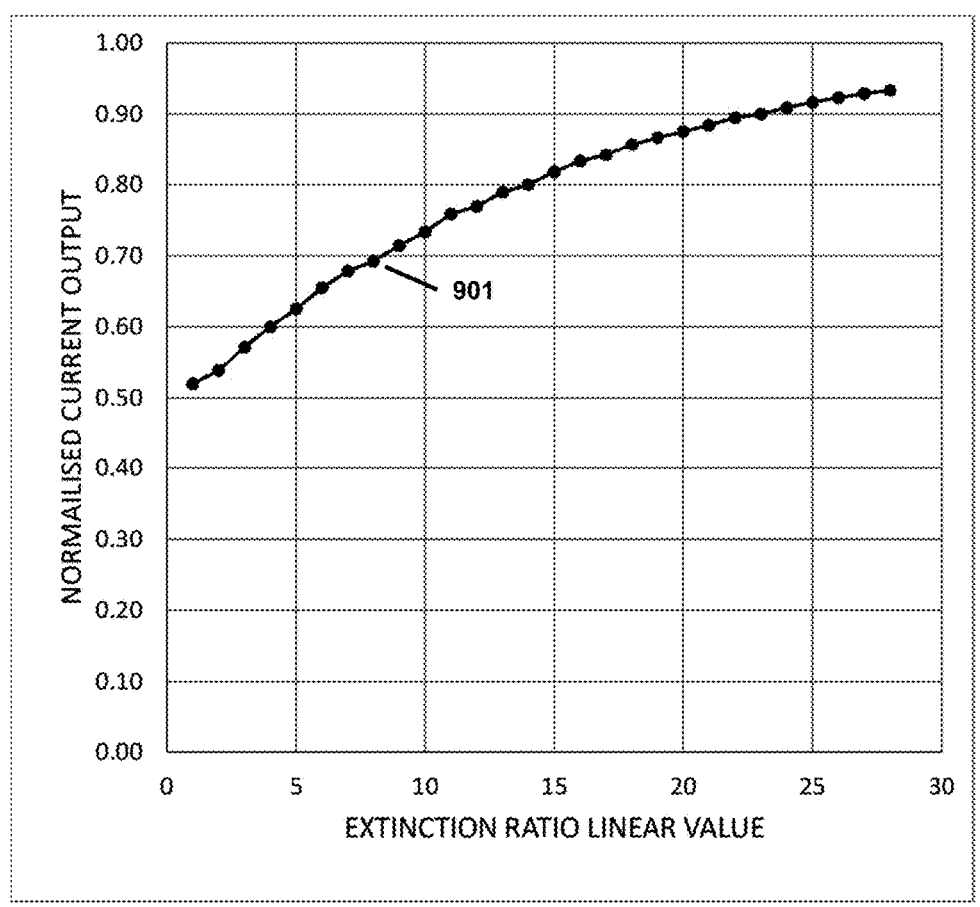
FIG. 9 shows a plot of the normalised output current from a digital to analogue converter as a function of the input code corresponding to ER in linear form.

FIG. 9 shows a plot 901 of the normalised output current from a circuit containing some embodiments of the invention such as in FIG. 6 as a function of the individual steps of the look up table.

Figure 10:
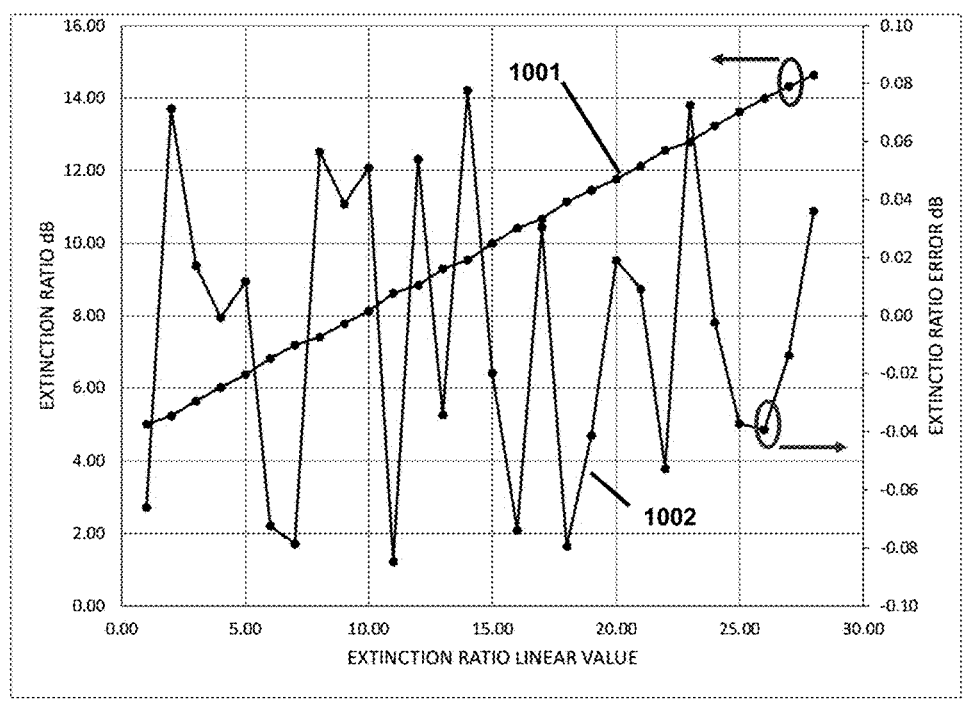
FIG. 10 is a plot showing the ER in the replica current achieved and the error from the ideal case in decibels using an exemplar capacitance measurement arrangement for the monitor channel.

FIG. 10 shows a plot 1001 of the ideal ER in dB that would be achieved with an ideal replica feedback control system as a function of the individual steps of the look up table. Also in FIG. 10 is shown the error in dB 1002 between the desired ER and the ER that would result from the replica currents 503 and 504 in an ideal laser power and modulation control system.

Whilst this invention has been described with reference to particular examples and possible embodiments thereof these should not be interpreted as restricting the scope of the invention in any way. It is to be made clear that many other possible embodiments, modifications and improvements may be incorporated into or with the invention without departing from the scope and spirit of the invention as set out in the claims.

The invention claimed is:

1. A system for controlling an optical data transmitter comprising:
   current driver circuitry configured to supply a drive current to a laser diode; and
   monitor circuitry, said monitor circuitry comprising:
      a photodiode; and
      a first transimpedance amplifier coupled to said photodiode, wherein said monitor circuitry is configured to provide an output current related to an optical intensity of said laser diode;
      a second transimpedance amplifier, said second transimpedance amplifier configured to be substantially identical in construction to said first transimpedance amplifier;
   control circuitry configured to control said current driver circuitry configured to compare at least one property of outputs of said first and second transimpedance amplifiers, and generate at least one control signal to control said current driver circuitry based on the comparison, wherein
   the control circuitry comprises a reference current generator which comprises:
      a defined current source;
      a voltage controlled current source configured to generate said reference current configured to generate at least two currents whose magnitudes are in a fixed ratio wherein at least one of said currents is coupled to said second transimpedance amplifier and whose output is used by said control circuitry to control said current driver circuitry;
      a first plurality of serially coupled resistors, each resistor from the first plurality of serially coupled resistors being a unit resistor and configured such that one end of the first plurality of serially coupled resistors is coupled to a first reference voltage; and
      a first plurality of switches, configured such that at least one switch of the first plurality of switches is associated with one of the first plurality of serially coupled resistors, and configured to couple the defined current source and a first controlling input terminal of the voltage controlled current source to a same resistor from the first plurality of serially coupled resistors;
      a second plurality of serially coupled resistors, each resistor of the second plurality of resistors being a unit resistor whose resistance is substantially identical to the unit resistors in the said first plurality of serially coupled resistors and configured such that one end of the second plurality of serially coupled resistors is coupled to the said reference voltage;
      a second plurality of switches, configured such that at least one switch of the second plurality of switches is associated with one of the second plurality of serially coupled resistors, and configured to couple a first current from the voltage controlled current source and a second controlling input terminal of the voltage controlled current source to a same resistor from the second plurality of serially coupled resistors; and
      a look-up-table configured to control the first plurality of switches and the second plurality of switches based on an input to control a ratio between the defined current source current and at least one of the voltage controlled current source current.

2. The system as claimed in claim 1, wherein the first plurality of switches comprises a first array of switches configured to couple the first plurality of serially coupled resistors to the defined current source, and a second array of switches configured to couple the first plurality of serially coupled resistors to a first controlling input terminal of the voltage controlled current source, wherein the look-up-table is configured to select one from the first array of switches and one from the second array of switches such that one of the first plurality of serially coupled resistors is coupled to the defined current source via the selected one from the first array of switches and coupled to said first controlling input terminal of the voltage controlled current source via the selected one from the second array of switches.

3. The system as claimed in claim 2, wherein the second plurality of switches comprises a third array of switches configured to couple the second plurality of serially coupled resistors to a second controlling input terminal of the voltage controlled current source, and a fourth array of switches configured to couple the second plurality of serially coupled resistors to said current from the voltage controlled current source, wherein the look-up-table is configured to select one from the third array of switches and one from the fourth array of switches such that one of the second plurality of serially coupled resistors is coupled to said second controlling input terminal of the voltage controlled current source via the selected one from the third array of switches and coupled to the said first current from the voltage controlled current source via the selected one from the fourth array of switches.

4. The system as claimed in claim 1, wherein the voltage controlled current source comprises:
an amplifier comprising the first controlling input selectively coupled by the first plurality of switches to the first plurality of resistors, and a second input selectively coupled by the second plurality of switches to the second plurality of resistors;
at least one MOS transistor, a gate terminal of the at least one MOS transistor configured to be coupled to the output of the amplifier.

5. The system as claimed in claim 4, wherein the voltage controlled current source further comprises at least one further MOS transistor arranged in a cascode arrangement with the at least one MOS transistor.

6. The system as claimed in claim 1, wherein the look-up-table is configured to control the first plurality of switches and the second plurality of switches based on an input defining the ratio between the defined current source current and at least one of the voltage controlled current source currents based on a modulation depth and/or extinction ratio of the laser diode.

7. The system as claimed in claim 1, wherein the look-up-table configured to control the first plurality of switches and the second plurality of switches is generated by:
searching all integer division ratios possible with a first number of the first plurality of resistors and a second number of the second plurality of resistors; and
comparing each ratio with a desired value; and
choosing an integer ratio with a lowest error from the desired value as the selection for controlling the first plurality of switches and the second plurality of switches.

8. The system as claimed in claim 7, wherein the look-up-table configured to control the first plurality of switches and the second plurality of switches is further generated by:
detecting at least two integer division ratios providing the lowest error;
choosing an integer division ration from the at least two integer division ratios with a largest common multiple of unit value resistors that can be achieved.

9. The system as claimed in claim 1, wherein each resistor of the first plurality of resistors and the second plurality of resistors has the same physical size within an integrated circuit which comprises the system.

10. A method for controlling an optical data transmitter comprising:
supplying a drive current to a laser diode; and
providing an output current related to an optical intensity of said laser diode;
coupling a first transimpedance amplifier coupled to said output current;
providing a second transimpedance amplifier, said second transimpedance amplifier configured to be substantially identical in construction to said first transimpedance amplifier;
generating a reference current by:
providing a defined current source;
providing a voltage controlled current source configured to generate said reference current and configured to generate at least two currents whose magnitudes are in a fixed ratio wherein at least one of said currents is coupled to said second transimpedance amplifier, whose output is used to control said drive current;
providing a first plurality of serially coupled resistors, each resistor from the first plurality of serially coupled resistors being a unit resistor and coupled such that one end of the first plurality of serially coupled resistors is coupled to a first reference voltage;
providing a first plurality of switches, coupled such that at least one switch of the first plurality of switches is associated with one of the first plurality of serially coupled resistors, and able to couple the defined current source and a first controlling input terminal of the voltage controlled current source to a same resistor from the first plurality of serially coupled resistors;
providing a second plurality of serially coupled resistors, each resistor from the second plurality of serially coupled resistors being a unit resistor whose resistance is substantially identical to the unit resistors in said first plurality of serially coupled resistors and coupled such that one end of the second plurality of serially coupled resistors is coupled to said reference voltage;
providing a second plurality of switches, coupled such that at least one switch of the second plurality of switches is associated with one of the second plurality of serially coupled resistors, and able to couple a first current from the voltage controlled current source and a second controlling input terminal of the voltage controlled current source to a same resistor from the second plurality of serially coupled resistors; and
controlling the first plurality of switches and the second plurality of switches by providing a look-up-table based on an input to control a ratio between the defined current source current and at least one of the voltage controlled current source at least two currents; and
controlling said drive current based on the reference current and comparing at least one property of outputs of said first and second transimpedance amplifiers.

11. The method as claimed in claim 10, wherein providing the first plurality of switches comprises:
providing a first array of switches coupling the first plurality of serially coupled resistors to the defined current source;
providing a second array of switches coupling the first plurality of serially coupled resistors to the first controlling input terminal of the voltage controlled current source, wherein controlling the first plurality of switches and the second plurality of switches comprises:
selecting one from the first array of switches and one from the second array of switches such that one of the first plurality of serially coupled resistors is coupled to the defined current source via the selected one from the first array of switches and coupled to said first controlling input terminal of the voltage controlled current source via the selected one from the second array of switches.

12. The method as claimed in claim 11, wherein providing the second plurality of switches comprises:

providing a third array of switches coupling the second plurality of serially coupled resistors to a second controlling input terminal of the voltage controlled current source;

providing a fourth array of switches coupling the second plurality of serially coupled resistors to a first current from the voltage controlled current source, wherein controlling said drive current further comprises selecting one from the third array of switches and one from the fourth array of switches such that one of the second plurality of serially coupled resistors is coupled to said second controlling input terminal of the voltage controlled current source via the selected one from the third array of switches and coupled to the said first current from the voltage controlled current source via the selected one from the fourth array of switches.

13. The method as claimed in claim 10, wherein providing the voltage controlled current source comprises:

providing an amplifier comprising:
the first controlling input selectively coupled by the first plurality of switches to the first plurality of resistors, and
the second controlling input selectively coupled by the second plurality of switches to the second plurality of resistors; and providing at least one MOS transistor, a gate terminal of the at least one MOS transistor coupled to the output of the amplifier.

14. The method as claimed in claim 13, wherein providing the voltage controlled current source further comprises providing at least one further MOS transistor arranged in a cascode arrangement with the at least one MOS transistor.

15. The method as claimed in claim 10, wherein controlling the first plurality of switches and the second plurality of switches comprises controlling the first plurality of switches and the second plurality of switches based on an input defining the ratio between the defined current source current and at least one of the voltage controlled current source current based on a modulation depth and/or extinction ratio of the laser diode.

16. The method as claimed in claim 10, further comprising generating the look-up-table controlling the first plurality of switches and the second plurality of switches by:

searching all integer division ratios possible with a first number of the first plurality of resistors and a second number of the second plurality of resistors;

comparing each ratio with a desired value; and choosing an integer ratio with a lowest error from the desired value as the selection for controlling the first plurality of switches and the second plurality of switches.

17. The method as claimed in claim 16, wherein generating the look-up-table controlling the first plurality of switches and the second plurality of switches further comprises:

detecting at least two integer division ratios providing the lowest error;

choosing an integer division ration from the at least two integer division ratios with a largest common multiple of unit value resistors that can be achieved.

18. The method as claimed in claim 10, further comprising providing each resistor of the first plurality of resistors and the second plurality of resistors as the same physical size within an integrated circuit.

* * * * *